US005576704A

United States Patent [19]

Baker et al.

[11] Patent Number: 5,576,704

[45] Date of Patent: Nov. 19, 1996

[54] CAPACITIVE JOYSTICK APPARATUS

[75] Inventors: Thomas M. Baker, Peoria, Ill.; Michael Furlong, Cambridge, Minn.; John F. Szentes, Peoria, Ill.; Jay Tschetter, Plymouth, Minn.

[73] Assignee: Caterpillar Inc., Peoria, Ill.

[21] Appl. No.: 347,663

[22] Filed: Dec. 1, 1994

[51] Int. Cl.$^6$ .......... H03K 17/94

[52] U.S. Cl. .......... 341/20; 341/33; 74/471 XY; 200/6 A

[58] Field of Search .......... 341/20, 33; 74/471 XY; 200/6 A; 340/456; 345/161; 273/148 B

[56] References Cited

U.S. PATENT DOCUMENTS

| | | | |
|---|---|---|---|
| 3,779,095 | 12/1973 | Audet | 74/471 XY |
| 4,161,726 | 7/1979 | Burson et al. | 340/365 |
| 4,259,637 | 3/1981 | Bloomfield et al. | 324/166 |
| 4,305,007 | 12/1981 | Hughes | 307/116 |
| 4,386,312 | 5/1983 | Briefer | 324/60 |
| 4,434,412 | 2/1984 | Ruumpol | 336/134 |
| 4,489,303 | 12/1984 | Martin | 338/128 |
| 4,654,576 | 3/1987 | Oelsch et al. | 322/3 |
| 4,685,678 | 8/1987 | Frederiksen | 273/148 |
| 4,712,376 | 12/1987 | Hadank et al. | 60/427 |
| 4,794,321 | 12/1988 | Dotsko | 324/61 |
| 4,795,952 | 1/1989 | Brandstetter | 318/560 |
| 4,825,157 | 4/1989 | Mikan | 324/208 |
| 4,862,063 | 8/1989 | Kobayashi et al. | 324/61 |
| 4,863,337 | 9/1989 | Ishiguro et al. | 74/471 XY |
| 4,864,295 | 9/1989 | Rohr | 340/870.37 |
| 4,879,556 | 11/1989 | Duimel | 341/20 |
| 4,961,055 | 10/1990 | Habib et al. | 324/662 |
| 5,002,241 | 3/1991 | Tizac | 74/471 XY |
| 5,002,454 | 3/1991 | Hadank et al. | 414/695.5 |
| 5,050,272 | 8/1991 | Fritzsche | 19/104 |
| 5,068,499 | 11/1991 | Kuratani | 200/6 A |
| 5,112,184 | 5/1992 | Tapper et al. | 414/728 |
| 5,140,320 | 8/1992 | Gerbier et al. | 341/20 |
| 5,160,918 | 11/1992 | Saposnik et al. | 74/471 XY |
| 5,164,722 | 11/1992 | Laroze et al. | 341/20 |
| 5,184,646 | 2/1993 | Hori et al. | 74/471 XY |
| 5,421,694 | 6/1995 | Baker et al. | 74/471 XY |
| 5,424,623 | 6/1995 | Allen et al. | 74/471 XY |
| 5,468,924 | 11/1995 | Naitou et al. | 74/471 XY |

FOREIGN PATENT DOCUMENTS

| | | |
|---|---|---|
| 0361666 | 4/1990 | European Pat. Off. . |
| 63-214601 | 9/1988 | Japan . |
| 325802 | 2/1930 | United Kingdom . |
| 2060173 | 4/1981 | United Kingdom . |
| 2072856 | 10/1981 | United Kingdom . |
| WO8806242 | 8/1988 | WIPO . |
| WO8909927 | 10/1989 | WIPO . |

OTHER PUBLICATIONS

"Handbook of Transducers for Electronic Measuring Systems", Harry N. Norton, pp. 168–169, Copyright 1969.

"Linear Displacement Measurement Circuit", Lewis D. Meixler.

"What's Behind that Joystick?", D. D. Shumann, 1988.

Appln. No. 08/083,414, filed Jun. 28, 1993, "Apparatus for Determining the Position & Velocity of a Moving Object", Baker et al, Docket No. 93-100.

*Primary Examiner*—Jeffery Hofsass
*Assistant Examiner*—Timothy Edwards, Jr.
*Attorney, Agent, or Firm*—David M. Masterson

[57] ABSTRACT

In one aspect of the present invention, a joystick is disclosed. The joystick includes a control shaft having an operator handle and a base. A cardan joint is provided to pivotally mount the control shaft to the base. An actuating body is rigidly attached to the control shaft. Advantageously, a plurality of electrically non-contacting sensors is provided to sense the relative position of the shaft relative to the base. The sensors include a pair of spaced apart electrodes establishing an electrostatic capacity with each other, and a dielectric body being disposed between the electrode pair. Accordingly, as the control shaft pivots, the actuating body engages the dielectric body which moves the dielectric body relative to the electrode pair thereby modifying the capacitance of the sensor.

16 Claims, 11 Drawing Sheets

CAPACITIVE JOYSTICK APPARATUS

TECHINICAL FIELD

This invention relates generally to a joystick and, more particularly, to a joystick that uses capacitive technology to determine the joystick position.

BACKGROUND ART

In the field of work machines, particularly those machines which perform digging or loading functions such as excavators, backhoe loaders, and front shovels, the work implements are generally manually controlled with two or more operator controls in addition to other machine function controls. The manual control system often includes foot pedals as well as hand operated levers. There are several areas in which these types of implement control schemes can be improved to alleviate operator stress and fatigue resulting from the manipulation of multiple levers and foot pedals. For example, a machine operator is required to possess a relatively high degree of expertise to manipulate and coordinate the multitude of control levers and foot pedals proficiently. To become productive an inexperienced operator requires a long training period to become familiar with the controls and associated functions.

Some manufacturers recognize the disadvantages of having too many control levers and have adapted a two-lever control scheme as the norm. Generally, two vertically mounted joysticks share the task of controlling the linkages (boom, stick, and bucket) of the work implement. For example, Caterpillar excavators employ one joystick for stick and swing control, and another joystick for boom and bucket control. However, the two-lever control scheme presently used in the industry may still be improved to provide for better productivity.

One disadvantage of the joysticks of this type is the use of contacting switches or resistive potentiometers. However, the use of such switches or potentiometers are subject to wear, necessitating switch replacement or repair. Thus, the long term cost of such joysticks is quite high. Further, when a joystick is not operating properly, the machine cannot be used. This "down-time" greatly adds unacceptable burdens to the machine owner/lessor due to time restrictions on most jobs.

Several attempts have been made to overcome the problems of contact-type joysticks. For example, the non-contacting control-handle discussed in U.S Pat No. 4,434,412 and the control signal generator discussed in U.S. Pat No. 4,654,576 each teach the use of inductive sensors for detecting the displacement of a control shaft from a neutral position. However, such inductive sensors are susceptible to electromagnetic interference, prone to wire breakage, complex to manufacture, and require drive circuitry for operation.

Another type of non-contacting joystick is discussed in U.S. Pat No. 4,489,303, which teaches the use of Hall effect devices to detect the position of the control shaft from a neutral position. However, Hall effect devices have problems similar to the inductive sensors discussed above. Further, this particular joystick arrangement is limited to detecting only a limited number of discrete positions of the control shaft. For example, a magnet disposed on the control shaft can actuate only one of the Hall effect switches at any particular time. Thus the resulting positional information has poor resolution leading to poor accuracy.

Additionally, each of the described devices only provide for two-axis detection. Thus, more than one device is needed to control the work implement in the above described machines.

The present invention is directed to overcoming one or more of the problems as set forth above.

DISCLOSURE OF THE INVENTION

In one aspect of the present invention, a joystick is disclosed. The joystick includes a control shaft having an operator handle and a base. A cardan joint is provided to pivotally mount the control shaft to the base. An actuating body is rigidly attached to the control shaft. Advantageously, a plurality of electrically non-contacting sensors is provided to sense the relative position of the shaft relative to the base. The sensors include a pair of spaced apart electrodes establishing an electrostatic capacity with each other, and a dielectric body being disposed between the electrode pair. Accordingly, as the control shaft pivots, the actuating body engages the dielectric body which moves the dielectric body relative to the electrode pair thereby modifying the capacitance of the sensor.

BRIEF DESCRIPTION OF THE DRAWINGS

For a better understanding of the present invention, reference may be made to the accompanying drawings in which.

BEST MODE FOR CARRYING OUT THE INVENTION

Figure 1:
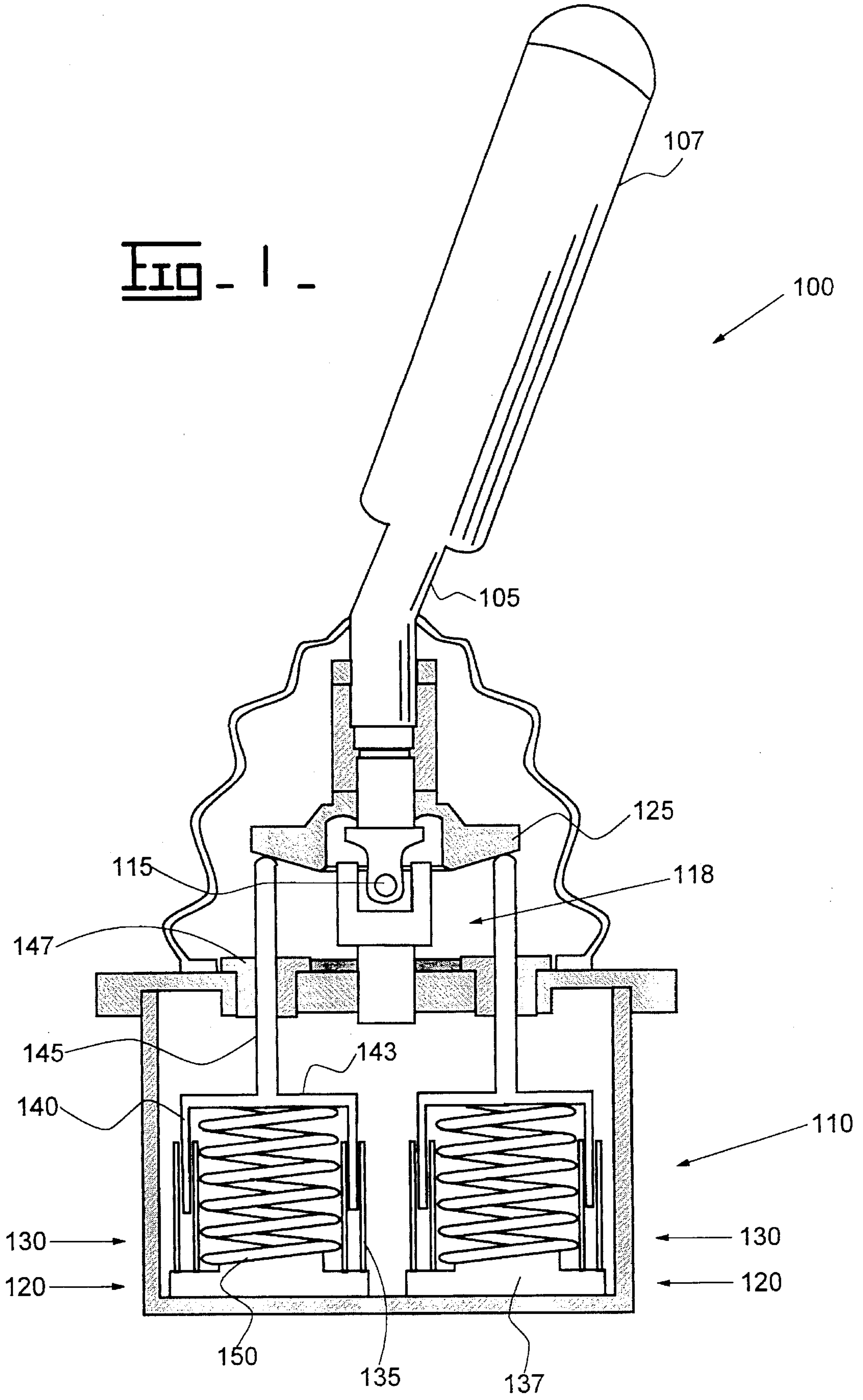
FIG. 1 shows a longitudinal section of a joystick.

Referring now to the drawings, wherein a preferred embodiment of the present invention is shown, FIG. 1 illustrates a joystick 100. The joystick includes a control shaft 105 having a handle 107, which is universally, pivotally mounted relative to a base portion 110 about a pivotal point 115 in the form of a cardan joint 118. An actuating body 125 in the form of a disk is rigidly attached to the control shaft 105 about the pivot mounting 118. The actuating body 125 has a tapered annular surface on the side facing the base portion 110. A sensor means 120 responds to the deflection of the control shaft 105.

The sensor means 120 is formed by four electrostatic or capacitive sensors 130, which are displaced diametrically from one another on the base portion 110. Each sensor 130 includes a pair of spaced apart electrodes 135 that define coaxial cylindrical surfaces held in place by an annular support 137, which is made of electrically insulative material. For example, the outer electrode may function as a positive electrode, while the inner electrode may function as a negative electrode.

A cylindrical dielectric body 140 is disposed in the annular space defined by the electrode pair. The dielectric body 140 includes a radially extending disk-shaped section 143 and a rod member 145. The disk-shaped section 143 and rod member 145 are integrally formed with the cylindrical portion of the dielectric body 140. The rod member extends through guide bearings 147 toward the actuating body. The dielectric body may be made of a material known as PVDF, which is also known as, polyvinylidene fluoride. A spring member 150 is disposed within a chamber defined by the dielectric body and electrode pair. The spring is adapted to bias the rod member against the actuating body.

Figure 2:
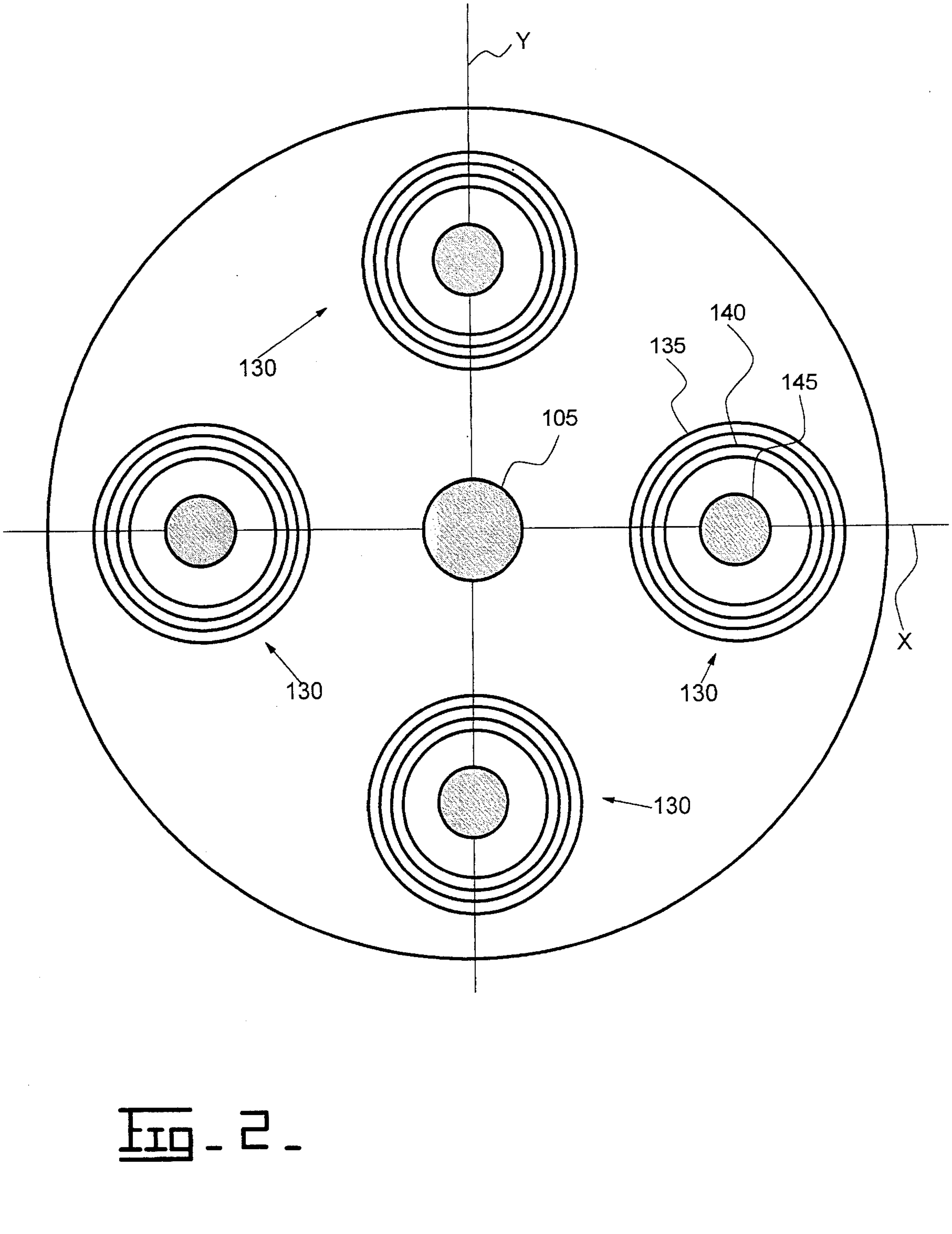
FIG. 2 shows a cross sectional view of the joystick taken about a base portion.

Advantageously, each sensor forms a variable capacitor, the capacitance value of which varies as a function of the relative position of the dielectric body to the electrode pair. In operation, the actuating body 125 engages the rod member 145, which moves the dielectric body 140 relative to the electrode pair 135 in response to pivotal movement of the control shaft 105. As shown in FIG. 2, four sensors 130 are spaced at substantially 90° intervals in a circumferential direction on the base.

Figure 3:
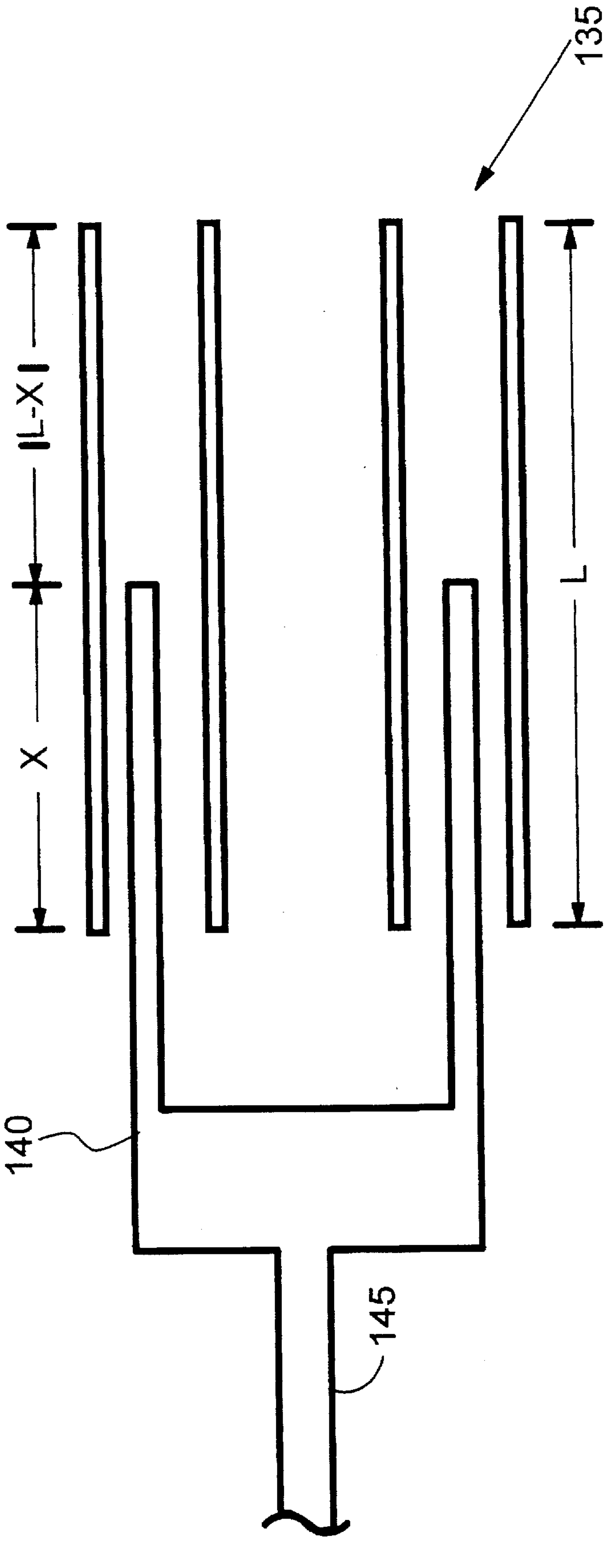
FIG. 3 shows a diagrammatic view of a capacitive sensor associated with the joystick.

The relationship between the capacitance of the electrode pair 135 and the relative position of the dielectric body 140 is now discussed, with respect to FIG. 3. The total capacitance, $C_{tot}$, of the variable capacitor 130 is shown by the following equation:

$$C_{tot}=(C_m*X)+(C_s*(L-X)) \quad \text{Eq. 1}$$

where the quantity ($C_m$*X) corresponds to the capacitance value associated with the dielectric body and the quantity ($C_s$*(L–X) corresponds to the capacitance value associated with the medium occupying the space between the fixed elements, e.g. air or hydraulic fluid.

Eq. 1, however, may be simplified by the following relationship:

$$\begin{aligned} C_{tot} &= X*(C_m-C_s)+(C_s*L) \quad \text{Eq. 2} \\ &= (a*X)+b \end{aligned}$$

where:

a=($C_m$–$C_s$), and b=($C_s$*L)

Figure 4:
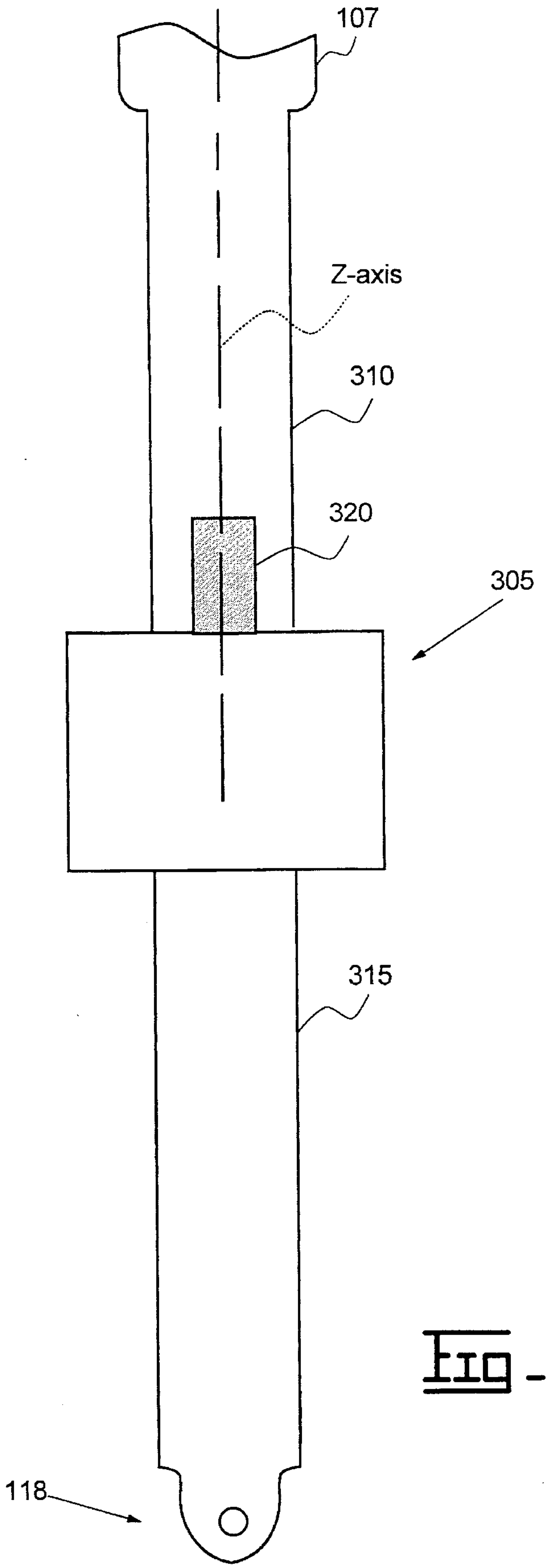
FIG. 4 shows a diagrammatic view of a joystick shaft.

The handle may be provided with rotational motion through a mechanical assembly 305. Referring now to FIG. 4, the control shaft 105 may include an upper shaft 310 that is connected to the handle 107, and a lower shaft 315 that is connected to the cardan joint 118. The upper shaft and the lower shaft are joined together via the mechanical assembly 305, such that the mechanical assembly provides the upper shaft with rotatable motion relative to a Z-axis.

Figure 5:
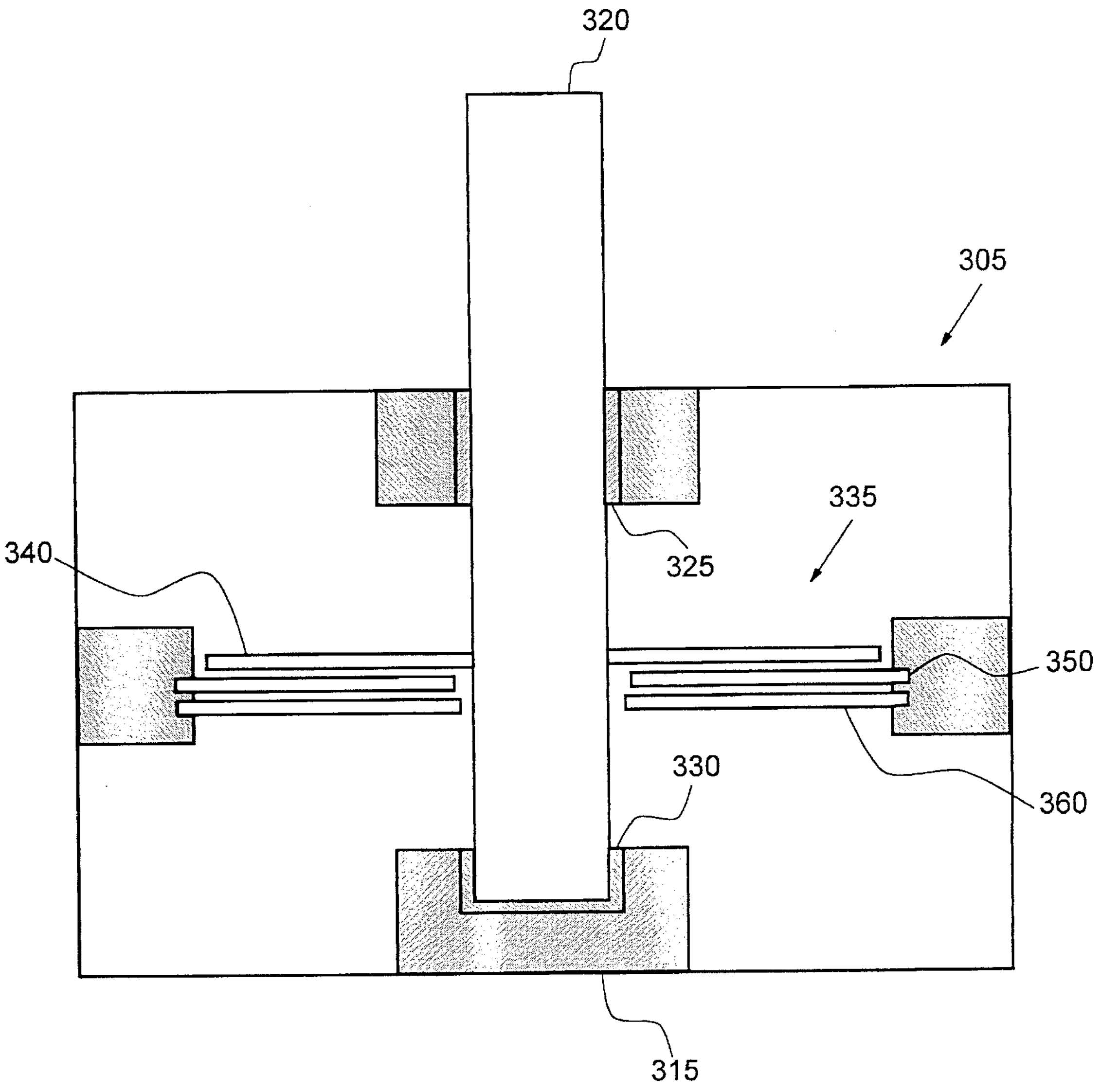
FIG. 5 shows a cross sectional side view of a mechanical assembly that provides and senses rotative motion of the joystick shaft.

A cross sectional view of the mechanical assembly 305 is shown in FIG. 5. A metal pin 320 that is affixed to the upper shaft 310 is rotatably attached to the mechanical assembly 305 via first and second bearings 325, 330. A rotational sensor in the form of a capacitive plate assembly 335 is provided to detect the rotational motion of the upper shaft 310 about the Z-axis. The capacitive plate assembly 335 includes a rotatable metal plate 340 that is affixed to the pin 320, a fixed dielectric plate 350, and a fixed metal plate 360.

Figure 6:
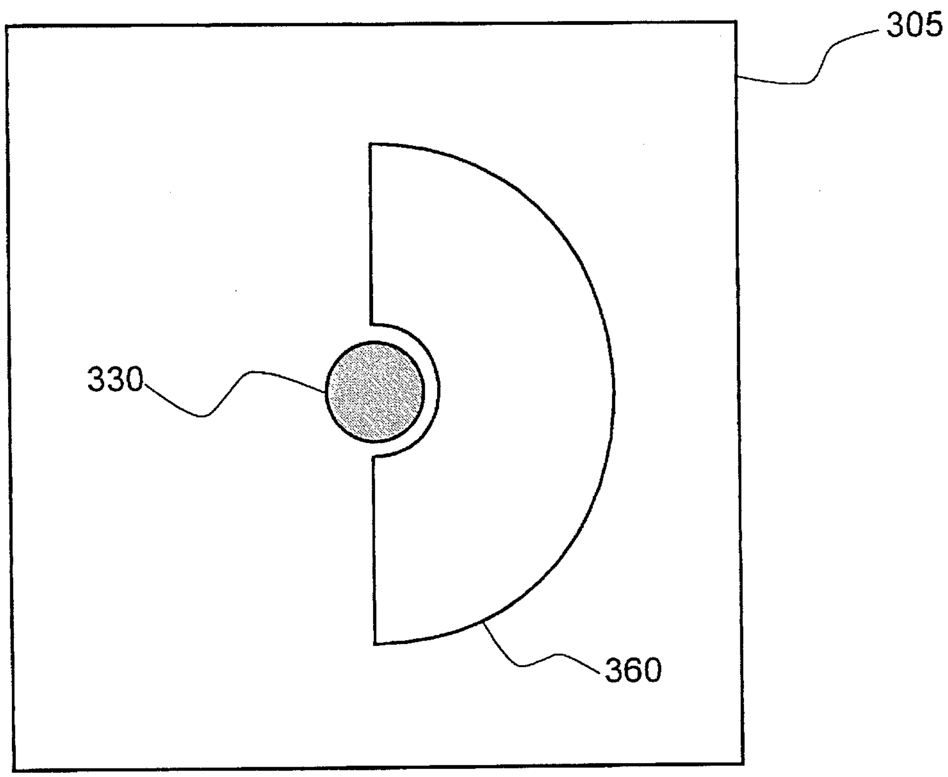
FIG. 6 shows a diagrammatic top level view of the mechanical assembly illustrating a fixed metal plate.
Figure 7:
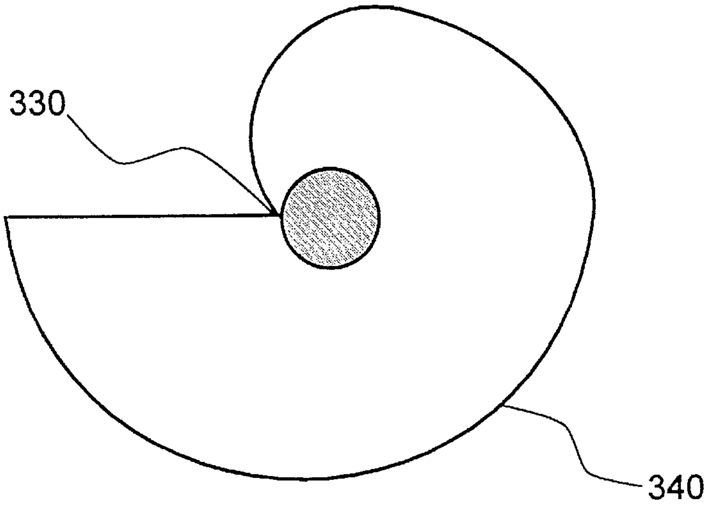
FIG. 7 shows a diagrammatic top level view of the mechanical assembly illustrating a rotatable metal plate affixed to the joystick shaft.

Referring now to FIG. 6, a top view of the fixed metal plate 360 is shown. Note that the fixed dielectric plate 350 is similar in shape and orientation to the fixed metal plate 360, e.g., a half circular shape. The rotatable metal plate 340, rather, has a varying circular shape, as shown in FIG. 7. Accordingly, as the rotatable metal plate 340 rotates, the capacitance value of the capacitive plate assembly 335 changes. Moreover, the shape of the rotatable metal plate 340 provides for the capacitance value of the capacitive plate assembly 335 to increase as the upper shaft 310 is rotated in one direction, while the capacitance value decreases as the upper shaft is rotated in the opposite direction.

Figure 8:
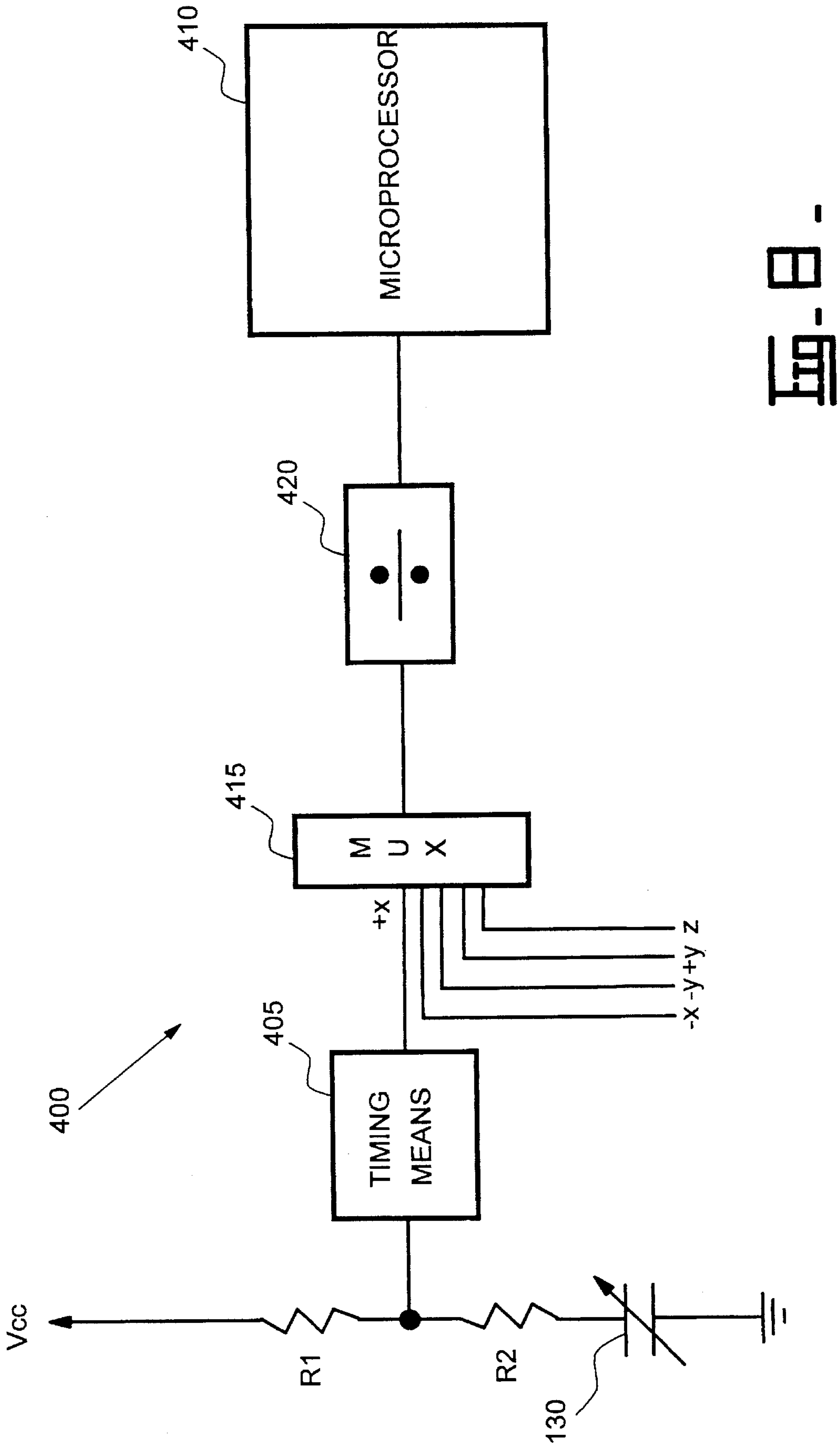
FIG. 8 shows a block diagram of one embodiment of the electronic circuitry associated with the joystick.

One example of the electronic circuitry used to detect the change in capacitance of the sensors 130 and/or plate assembly 335 is shown in FIG. 8. A distinguishing means 400 produces a plurality capacitive signals, each capacitive signal is representative of a capacitance value of a respective sensor 130 and/or plate assembly 335. More particularly, the distinguishing means 400 includes a timing means 405 that produces a capacitive signal in frequency modulation form. The frequency of the capacitive signal is responsive to the capacitance value of a respective sensor 130 and/or plate assembly 335. Specifically, the capacitive signal frequency is a function of an RC time constant given by a sensor 130 and resistors R1, R2. A distinct and separate timing means is provided for each sensor 130, as well as, one for the plate assembly 335. The timing means may include a LM555 timer or other well known timing circuits.

The period, T, of the capacitive signal is related to the capacitance value, $C_{tot}$, of the sensor 130 by the following equation:

$$\begin{aligned} T &= (0.693*(R1+2R2))*C_{tot} \quad \text{Eq. 3} \\ &= c*C_{tot} \end{aligned}$$

substituting $C_{tot}$ in Eq. 2, Eq. 3 becomes $$T=c*(a*X+b) \quad \text{Eq. 4}$$

since the constants, a,b and c are known values the period, T, represents the relative position of the dielectric body, X. The capacitive signal is then delivered to a control means 410, which measures the period of each capacitive signal.

Preferably, the control means 410 includes a microprocessor. Because the period of each capacitive signal yields information that is indicative of the relative position of the dielectric body, the angular orientation of the control shaft 105 may be determined. As shown, a multiplexer (MUX) 415 is used to route all the capacitive signals to the microprocessor 410. A divide-by counter 420 may be additionally be utilized to adjust the resolution of the capacitive signal.

Once the microprocessor 410 has received all the capacitive signals, the microprocessor then produces a plurality of position signals that are representative of the angular orientation of the control shaft.

For example, the microprocessor selects the +X capacitive signal via MUX 415. The microprocessor then measures the period corresponding to the +X capacitive signal and stores the measured period as CNTX1. Next, the microprocessor measures the period corresponding to the –X capacitive signal and stores the measured period as CNTX2. A differential signal, DIFFX, is then determined by subtracting CNTX2 from CNTX1, viz., $$DIFFX=CNTX1-CNTX2$$

Advantageously, the microprocessor produces an X-axis position signal having a pulse-width-modulation (PWM) form in response to the magnitude of the DIFFX differential signal. Accordingly, the duty cycle of the X-axis position signal represents the angular orientation of the control shaft relative to the x-axis.

The microprocessor performs a similar function to produce a Y-axis position signal, where the duty cycle of the Y-axis represents the angular orientation of the control shaft relative to the Y-axis.

Note that, because the angular orientation of the control shaft is based on information from at least two sensors, the present invention advantageously compensates for capacitance variations that are due to changing temperatures.

Now, with respect to the Z-axis, the microprocessor measures the period of the Z capacitive signal and produces a Z-axis position signal, where the period of the Z capacitive signal is represented by the duty cycle of the Z-axis position signal. The duty cycle of the Z-axis position signal represents the amount of rotation of the control shaft about the Z-axis.

A control means 805 receives the position signals and determines the angular orientation of the control shaft. For example, the control means 805 may employ a look-up table to store a plurality of PWM magnitudes for each axis. The PWM magnitudes will correspond to a plurality of angular values that represent the angular orientation of the control shaft relative to the particular axis.

The control means 805 then compares the actual PWM values to the stored PWM values and selects the corresponding angular value. The number of characteristics stored in memory is dependent upon the desired precision of the system. The table values may be based upon analysis of empirical data, for example.

Figure 9:
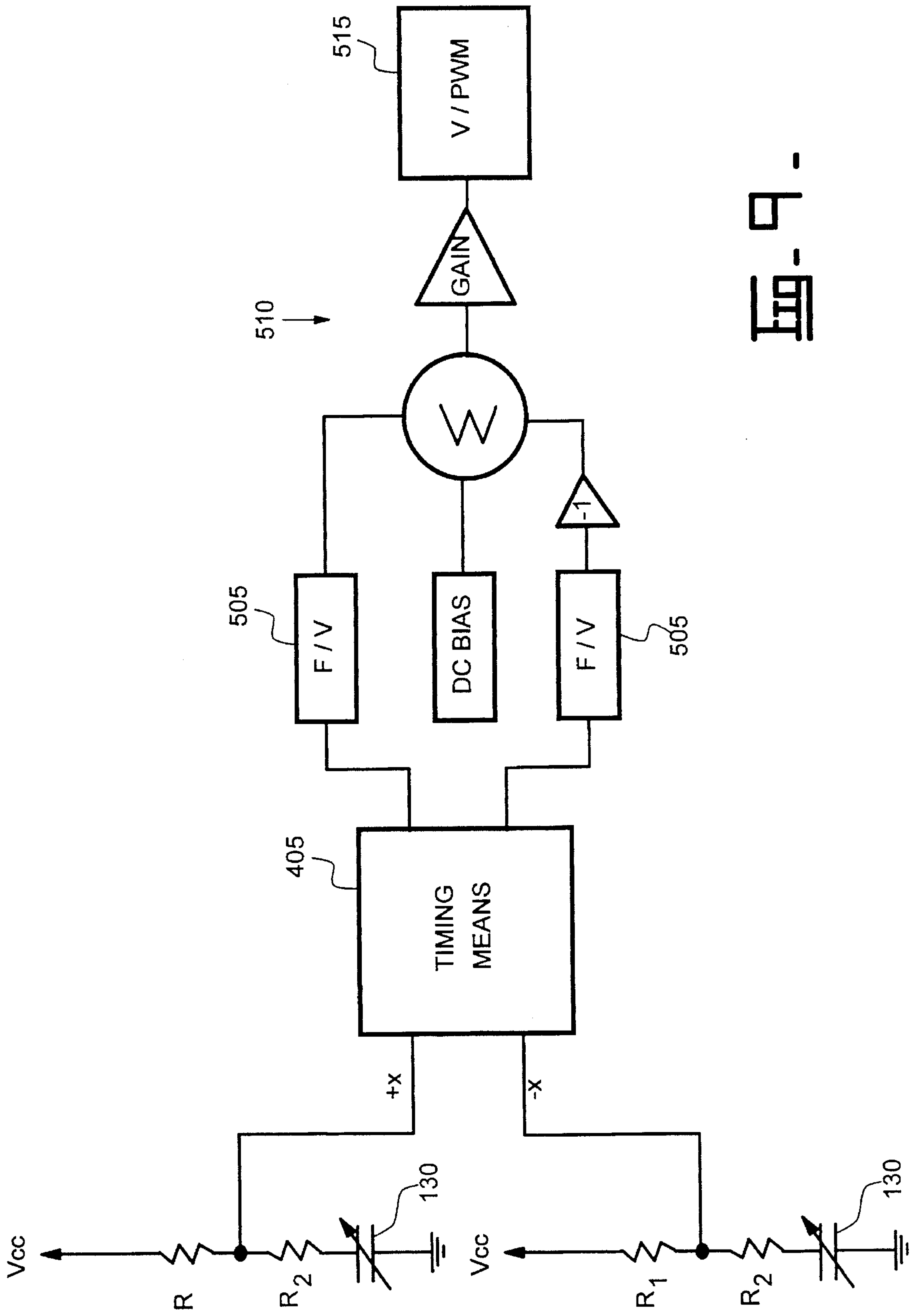
FIG. 9 shows a block diagram of another embodiment of the electronic circuitry associated with the joystick.

Another embodiment of the electronic circuitry used to detect the change in capacitance of the sensors 130 is shown in FIG. 9. The capacitive signals produced by the timing means 405 are converted from frequency modulation to a voltage form by a plurality of frequency to voltage (F/V) converters 505. The capacitive signals associated with diametrically opposed sensors 130 are then compared to each other by a summer 510 to produce a voltage differential signal. A voltage to pulse- width-modulation (V/PWM) converter 520 transforms the differential voltage signals to position signals having a PWM form. The position signals are then delivered to the control means 805 to determine the angular orientation of the control shaft.

Figure 10:
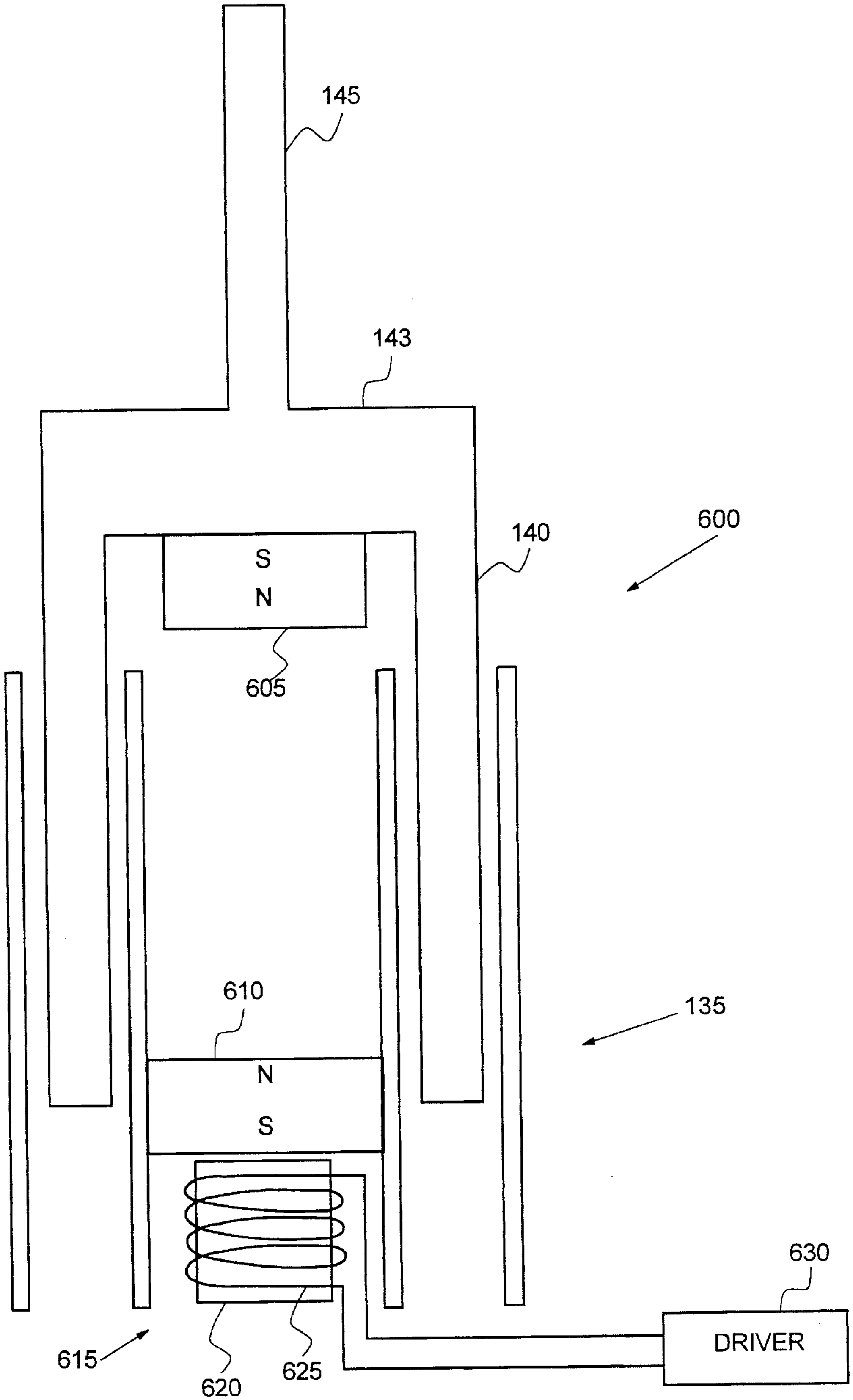
FIG. 10 shows a magnetic assembly of the joystick.

Referring now to FIG. 10, a magnetic means 600 is provided to enhance the "feel" of the joystick 100. The magnetic means 600 includes two permanent magnets 605, 610 that are provided to replace the spring 150. The magnets 605, 610 provide the necessary force to bias the rod member 140 against the actuating body 125. The magnetic means 600 further includes an electromagnet 615 that produces an electromagnetic force to further bias the rod member 140 against the actuating body 125. The electromagnet 615 includes a ferromagnetic core 620 and a plurality of coils 625 wrapped about the core 620. A current amplifier 630 energizes the coils 625 to produce an electromagnetic field. The electromagnet 615 provides the operator with tactile feedback, which will become more apparent from a further reading.

Thus, while the present invention has been particularly shown and described with reference to the preferred embodiment above, it will be understood by those skilled in the art that various additional embodiments may be contemplated without departing from the spirit and scope of the present invention.

INDUSTRIAL APPLICABILITY

The operation of the present invention is best described in relation to its use in the control of work implements on machines, particularly those machines which perform digging or loading functions such as excavators, backhoe loaders, and front shovels.

Figure 11:
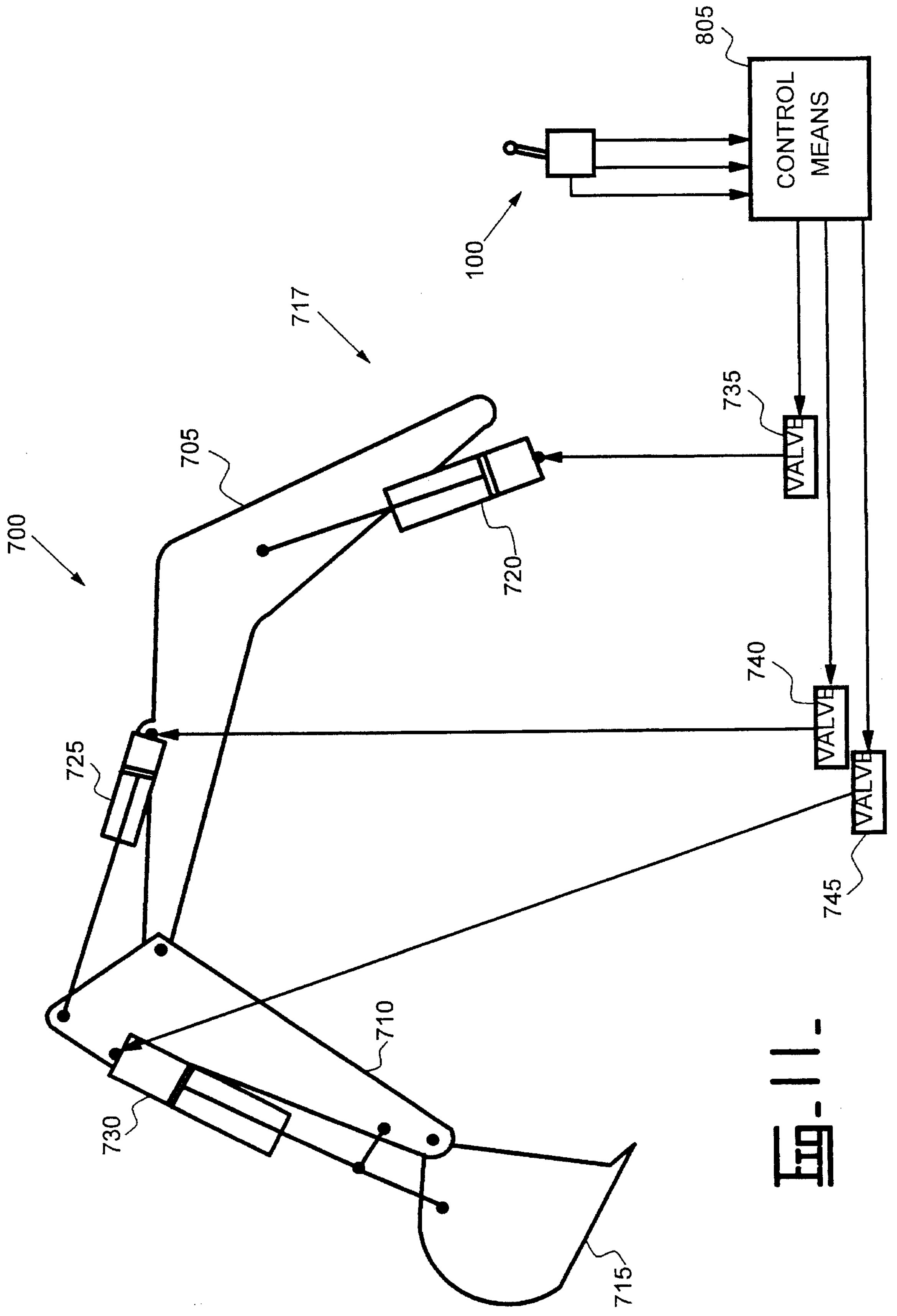
FIG. 11 shows a diagrammatic view of a control system in conjunction with a work implement.

Referring to FIG. 11, a work implement 700 under control typically consists of linkages such as a boom 705, stick 710, and bucket 715. The linkages are actuatable via an actuating means 717. The actuating means 717 may include a hydraulic cylinder, electromagnetic actuator, piezoelectric actuator, or the like.

The implement configuration may vary from machine to machine. In certain machines, such as the excavator, the work implement is rotatable along a machine center axis. Here, the work implement 700 is generally actuated in a vertical plane, and swingable through a horizontal plane by rotating on a machine platform or swinging at a pivot base on the boom 705. The boom 705 is actuated by two hydraulic cylinders 720 (one of which is shown) enabling raising and lowering of the work implement 700. The stick 710 is drawn inward and outward from the machine by a hydraulic cylinder 725. Another hydraulic cylinder 730 "opens" and "closes" the bucket 715. The hydraulic flow to the hydraulic cylinders are regulated by hydraulic control valves 735, 740, 745.

The operator interface for the control of the work implement 700 consists of only one joystick 100. Advantageously, the joystick 100 has "three" axis of movement: for example, pivotal movement in X and Y directions in the X-Y plane, and rotational movement about the Z-axis. The joystick 100 generates at least one position signal for each respective axis of movement, each signal representing the joystick displacement direction and velocity. The position signals are received by a control means 805, which responsively delivers a plurality of work implement control signals to the hydraulic control valves 735, 740, 745.

Figure 12:
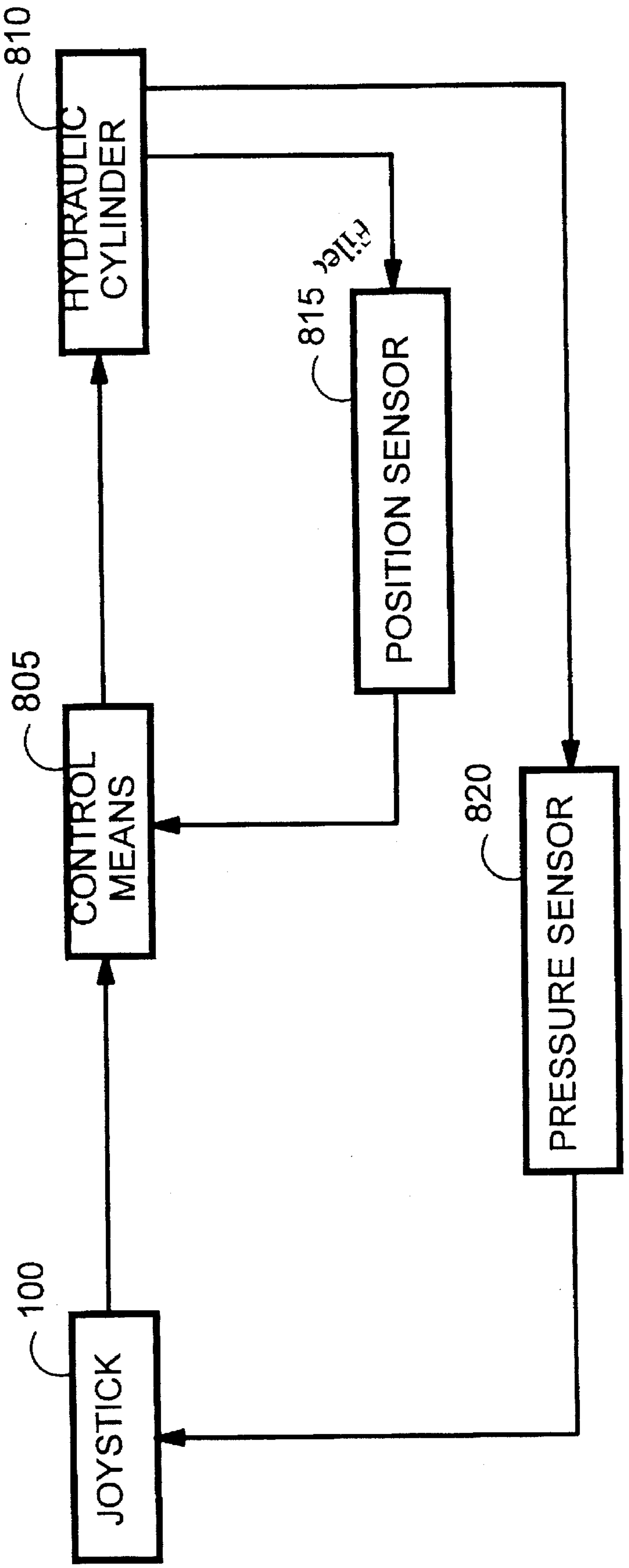
FIG. 12 shows a block diagram of the control system.

For example, the overall control system is shown with reference to FIG. 12, where the joystick 100 delivers the position signals to the control means 805. The position signals are representative of Cartesian coordinates corresponding to the joystick axes of movement. The control means 805 also receives linkages position data from sensors 815 such as linkage angle resolvers or RF cylinder position sensors such as known in the art. The control means 805 may transform the representative Cartesian coordinates into another coordinate system based on the configuration and position of the linkages in a well known manner.

The joystick 100 controls the work implement 700 in the following manner. The joystick 100 produces a first set of position signals that correspond to the horizontal movement of the control shaft 105 along the X-Y plane. The control means 410 receives the first set of position signals and delivers a plurality of work implement control signals to the respective hydraulic cylinders to produce a vertical motion of the boom 705 proportional to the direction of movement of the control shaft 105 along the X-axis. Further a horizontal motion of the stick 710 is produced proportional to the movement of the control shaft 110 along the Y-axis.

The joystick 100 produces a second set of position signals corresponding to the rotational motion of the handle 107 about the Z-axis. The control means 805 delivers a work implement control signal to the hydraulic cylinder 730 in response to receiving the second set of position signals. This produces a curling motion of the bucket 715 proportional to the magnitude and direction of the rotational movement of the handle 107 about the Z-axis.

It may be desirable to provide the operator with tactile or pressure feedback. For example, as shown in FIG. 12, a pressure sensor 820 senses the hydraulic fluid pressure imposed on the hydraulic cylinder and responsively produces a pressure signal having a magnitude proportional to the sensed fluid 10 pressure. The current amplifier 630 receives the pressure signal and responsively produces an energization signal having a magnitude proportional to the pressure signal magnitude. In response to receiving the energization signal the electromagnet 615 produces an electromagnetic force in proportion to the magnitude of the energization signal. The electromagnetic force opposes the operator force to provide the operator with feedback of the force imposed on the work implement. Thus, the operator is provided with a "feel" of the machine performance to enhance his work efficiency.

The above discussion primarily pertains to excavator or excavator type machines; however, it may be apparent to those skilled in the art that the present invention is well suited to other types work implement configurations that may or may not be associated with work machines.

Other aspects, objects and advantages of the present invention can be obtained from a study of the drawings, the disclosure and the appended claims.

We claim:

1. A joystick, comprising;

a control shaft having an operator handle;

a base;

means for universally, pivotally mounting the control shaft to the base;

an actuating body rigidly attached to the control shaft and adapted, upon pivotal movement of the control shaft from a central position, to approach the base on one side and to move away from the base on the other side; and a plurality of sensors located on the base, each sensor comprising:

a pair of spaced apart electrodes establishing an electrostatic capacity with each other;

a dielectric body being disposed between the electrode pair; and wherein the actuating body engages the dielectric body thereby moving the dielectric body relative to the electrode pair in response to pivotal movement of the control shaft.

2. A joystick, as set forth in claim 1, wherein each sensor forms a variable capacitor, the capacitance value of which varies as a function of the relative position of the dielectric body to the electrode pair.

3. A joystick, as set forth in claim 2, wherein the electrodes pair define coaxial cylindrical surfaces.

4. A joystick, as set forth in claim 3, wherein the dielectric body forms a cylinder and includes:

a radially extending disk-shaped section formed at the end of the cylindrical body; and a rod member rigidly attached to the disk-shaped section, the rod member extending toward the actuating body.

5. A joystick, as set forth in claim 4, wherein each sensor further includes a biasing means for biasing the rod member against the actuating body.

6. A joystick, as set forth in claim 5, including at least four sensors that are spaced at substantially 90° intervals in a circumferential direction about the base portion.

7. A joystick, as set forth in claim 6, including a mechanical assembly for providing the handle with rotatable motion about a Z-axis, and including a rotational capacitive sensor wherein the capacitance value is a function of the rotational movement of the handle about the Z-axis.

8. An apparatus for controlling a work implement on a machine, the work implement being movable by an actuating means, comprising:

a control shaft having an operator handle;

a base;

means for universally, pivotally mounting the control shaft to the base;

an actuating body rigidly attached to the control shaft and adapted, upon pivotal movement of the control shaft from a central position, to approach the base on one side and to move away from the base on the other side;

a plurality of sensors located on the base, each sensor having a pair of spaced apart electrodes forming a capacitor, and a dielectric body disposed between the electrode pair and adapted to be moved by the actuating body, the movement of the dielectric body causing the capacitance value of the sensor to change;

means for producing a plurality of position signals corresponding to the capacitance values of the sensors; and means for delivering a plurality of work implement control signals to the actuating means in response to receiving the position signals, the actuating means responsively moving the work implement proportional to the displacement and direction of the control shaft relative to a neutral position.

9. An apparatus, as set forth in claim 8, wherein the work implement includes:

a boom pivotally connected to the machine;

a stick pivotally connected to the boom; and a bucket pivotally connected to the stick, the boom, stick, and bucket each being independently, controllable and pivotally movable.

10. An apparatus, as set forth in claim 9, including at least four sensors that are spaced at substantially 90° intervals in a circumferential direction about the base portion, the capacitance value associated with each sensor representing the movement of the control shaft.

11. An apparatus, as set forth in claim 10, including an orthoginal X and Y axis established about the base portion, and further inclnding means for producing a first set of position signals corresponding to the pivotal movement of the control shaft, and wherein the control means delivers a plurality of work implement control signals to the actuating means in response to receiving the first set of position signals to produce a vertical motion of the boom proportional to the direction of movement of the control shaft along the X-axis, and a horizontal motion of the stick proportional to the movement of the control shaft along the Y-axis.

12. An apparatus, as set forth in claim 11, including a Z-axis extending through the intersection point of the X-Y axis, and further including a mechanical assembly for providing the handle with rotatable motion about a Z-axis, and including a rotational capacitive sensor wherein the capacitance value is a function of the rotational movement of the handle about the Z-axis.

13. An apparatus, as set forth in claim 12, including means for producing a second set of position signals corresponding to the rotational motion of the handle about the Z-axis, and wherein the control means delivers a work implement control signal to the actuating means in response to receiving the second set of position signals to produce a curling motion of the bucket proportional to the magnitude and direction of the rotational movement of the handle about the Z-axis.

14. An apparatus, as set forth in claim 13, wherein the control means adjusts the magnitude of the plurality of work implement control signals so that the velocity of displacement of the boom, stick, and bucket is proportional to the magnitude of displacement of the control shaft.

15. An apparatus, as set forth in claim 14, wherein the actuating means, includes:

a hydraulic cylinder; and means for sensing the hydraulic fluid pressure imposed on the hydraulic cylinder and responsively producing a pressure signal having a magnitude proportional to the sensed fluid pressure.

16. An apparatus, as set forth in claim 15, including:

means for receiving the pressure signal and responsively producing an energization signal having a magnitude proportional to the pressure signal magnitude; and an electromagnet for receiving the energization signal and producing an electromagnetic force proportional to the magnitude of the pressure signal that opposes the displacing force provided by the operator.

* * * * *